(12) United States Patent
Lichtenwalner et al.

(10) Patent No.: US 12,408,360 B2
(45) Date of Patent: Sep. 2, 2025

(54) VERTICAL POWER DEVICES HAVING MESAS AND ETCHED TRENCHES THEREBETWEEN

(71) Applicant: Wolfspeed, Inc., Durham, NC (US)

(72) Inventors: Daniel Jenner Lichtenwalner, Raleigh, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 381 days.

(21) Appl. No.: 17/744,604

(22) Filed: May 13, 2022

(65) Prior Publication Data

US 2023/0369445 A1 Nov. 16, 2023

(51) Int. Cl.
*H10D 12/01* (2025.01)
*H10D 12/00* (2025.01)
*H10D 62/832* (2025.01)

(52) U.S. Cl.
CPC ......... *H10D 12/032* (2025.01); *H10D 12/481* (2025.01); *H10D 62/8325* (2025.01)

(58) Field of Classification Search
CPC .................... H10D 62/8325; H10D 12/481
See application file for complete search history.

(56) References Cited

U.S. PATENT DOCUMENTS

| | | | |
|---|---|---|---|
| 9,887,287 B1 | 2/2018 | Lichtenwalner et al. | |
| 2005/0082542 A1* | 4/2005 | Sumakeris | H01L 29/7813 438/105 |
| 2007/0290212 A1* | 12/2007 | Mazzola | H01L 29/66068 257/77 |
| 2009/0261350 A1* | 10/2009 | Yamamoto | H10D 62/8325 257/77 |
| 2012/0261675 A1 | 10/2012 | Casady et al. | |
| 2014/0361349 A1 | 12/2014 | Alexandrov et al. | |
| 2015/0028350 A1* | 1/2015 | Suvorov | H10D 62/157 257/77 |
| 2015/0179791 A1* | 6/2015 | Kudou | H01L 21/31144 257/77 |

(Continued)

OTHER PUBLICATIONS

Chatty, et al., "900V, 1.46mOhm-cm2 4H-SiC Depletion Mode Vertical JFET," Materials Science Forum, vols. 740-742, Jan. 2013, Trans Tech Publications Ltd, pp. 915-920.

(Continued)

*Primary Examiner* — Evren Seven
(74) *Attorney, Agent, or Firm* — Sage Patent Group

(57) ABSTRACT

A vertical semiconductor and method for fabricating the same is disclosed. In one embodiment, fabrication entails providing a precursor comprising a substrate and a drift region over the substrate. A plurality of trenches is etched into the drift region from a top surface of the drift region such that a plurality of mesas remains in an upper portion of the drift region. The plurality of trenches is then filled with a first material. A vertical semiconductor device includes a plurality of mesas extends from an upper portion of the drift region, wherein there are no regrowth interfaces between the drift region and the plurality of mesas. A first material fills the trenches between each one of the plurality of mesas. At least one first contact over at least one of the plurality of mesas. At least one second contact over a bottom surface of the substrate.

23 Claims, 17 Drawing Sheets

(56) References Cited

U.S. PATENT DOCUMENTS

| | | | |
|---|---|---|---|
| 2015/0333175 A1* | 11/2015 | Kiyosawa | H01L 21/0455 257/77 |
| 2016/0064547 A1 | 3/2016 | Siemieniec et al. | |
| 2017/0170288 A1* | 6/2017 | Kiyosawa | H01L 29/4236 |
| 2018/0102435 A1 | 4/2018 | Hébert et al. | |
| 2019/0013416 A1* | 1/2019 | Zhang | H01L 29/0619 |
| 2021/0098568 A1 | 4/2021 | Lichtenwalner et al. | |

OTHER PUBLICATIONS

Tanaka, et al., "1.21mΩ cm2 SiC Buried Gate Static Induction Transistors (SiC-BGSITs)," Materials Science Forum, vols. 600-603, Sep. 2008, Trans Tech Publications Ltd, pp. 1071-1074.
International Search Report and Written Opinion of the International Searching Authority for PCT International Application No. PCT/US2023/019742 mailed Aug. 23, 2023, 15 pages.

\* cited by examiner

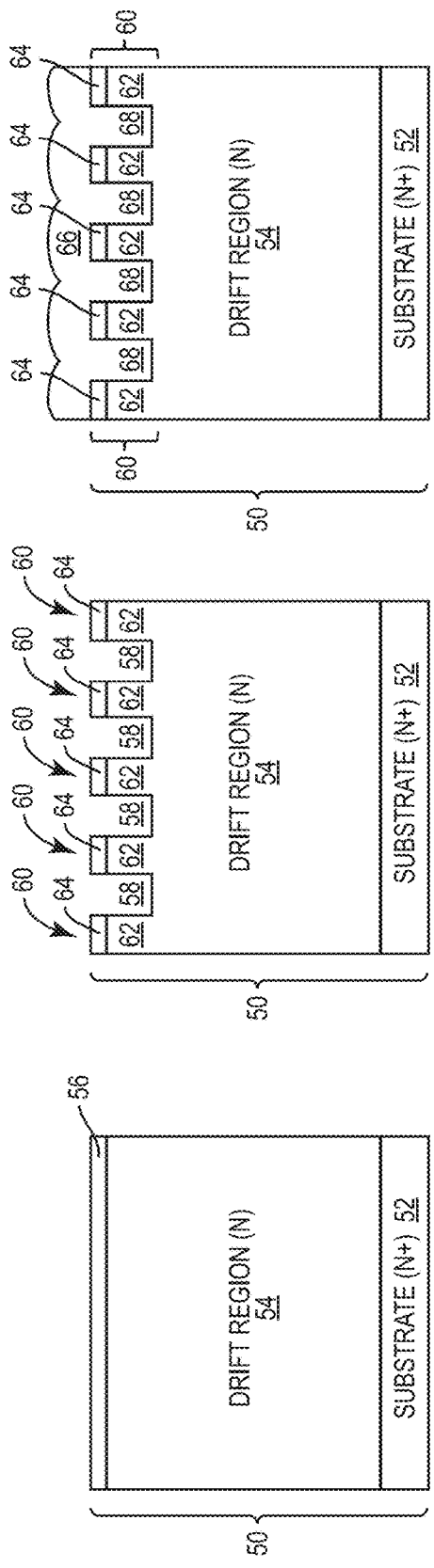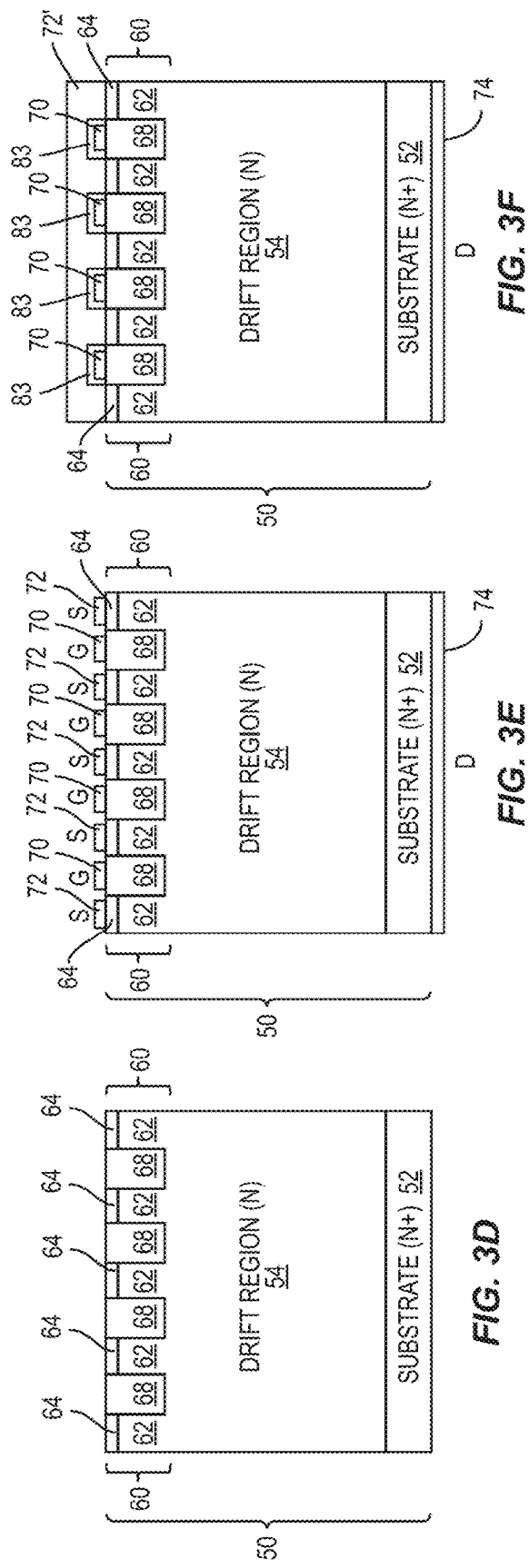

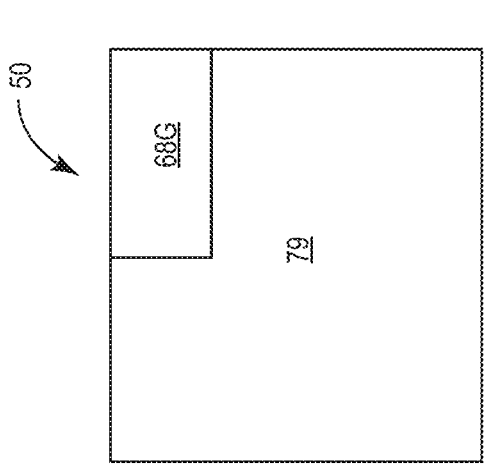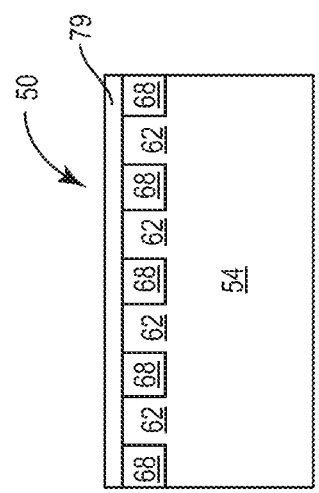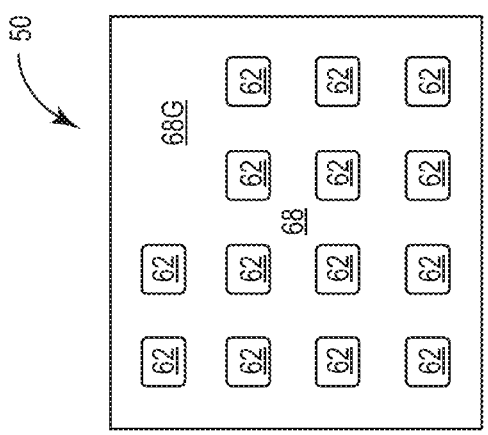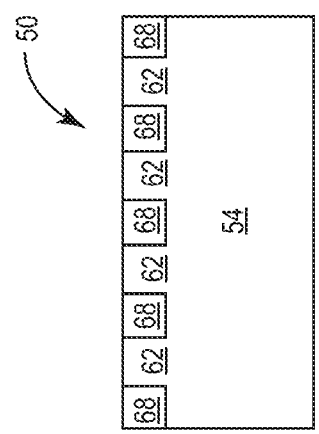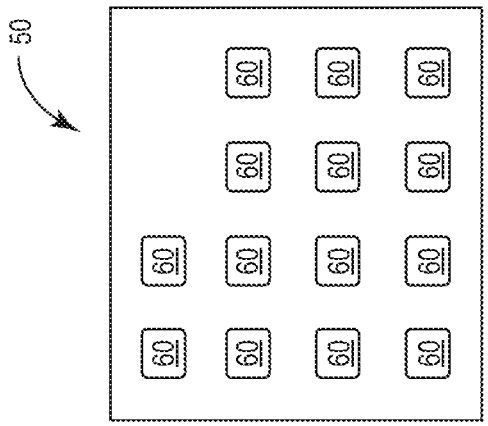

VERTICAL POWER DEVICES HAVING MESAS AND ETCHED TRENCHES THEREBETWEEN

FIELD OF THE DISCLOSURE

The present disclosure relates to vertical field effect devices with improved performance and efficient fabrication techniques for making the same.

BACKGROUND

Vertical semiconductor devices come in several varieties, each of which may be used for different applications. One notable use of vertical semiconductor devices is for high power applications. In particular, devices such as PiN diodes, Schottky diodes, metal-oxide semiconductor field-effect transistors (MOSFETs), junction field-effect transistors (JFETs), and the like may be rated for high blocking voltages and on-state currents, and thus are often used for these power applications. Given the ever-increasing pressure to provide higher performing devices at lower costs, there is continuing need for novel device structures and fabrication techniques that result in higher performance, lower cost, or both.

SUMMARY

A vertical semiconductor and method for fabricating the same is disclosed. In one embodiment, fabrication entails initially providing a precursor comprising a substrate and a drift region over the substrate, wherein the substrate and the drift region are doped with a dopant of a first type and formed from a first material system. A plurality of trenches is etched into the drift region from a top surface of the drift region such that a plurality of mesas remains in an upper portion of the drift region. The plurality of trenches is then filled with a first material doped with a dopant of a second type, which is opposite in polarity as the first type. At least one first contact is provided over at least one of the plurality of mesas, and at least one second contact is provided over a bottom surface of the substrate.

In another embodiment, a vertical semiconductor device includes a substrate and a drift region over the substrate. The substrate and the drift region are doped with a dopant of a first type and formed from a first material system. A plurality of mesas extends from an upper portion of the drift region, wherein there are no regrowth interfaces between the drift region and the plurality of mesas. A first material doped with a dopant of a second type fills the trenches between each one of the plurality of mesas, and the second type is opposite in polarity to the first type. At least one first contact is formed over at least one of the plurality of mesas. At least one second contact is formed over a bottom surface of the substrate.

The first material system may be silicon carbide and the first material may be silicon carbide, silicon, or a metal. During fabrication, the step of filling the plurality of trenches may include providing a first layer of the first material over the top surface of the drift region such that the plurality of trenches is filled and the plurality of mesas are covered, and planarizing the first layer to expose the plurality of mesas.

The vertical semiconductor device may be a transistor or diode. For a transistor, remaining portions of the first layer that fill the plurality of trenches form a plurality of gate regions, the at least one first contact is a source contact, and the at least one second contact is a drain contact. At least one gate contact is provided over at least a portion of the gate layer after planarizing the first layer.

In some embodiments, the at least one gate contact is not provided over the at least one gate region, wherein in others, the at least one gate contact includes a plurality of gate contacts that are each provided over a corresponding one of the plurality of gate regions.

In certain embodiments, after planarizing the first layer, a second layer is formed from the first material system over the plurality of mesas and remaining portions of the first layer, wherein the at least one first contact is provided over a portion of the first layer.

The drift region and the plurality of mesas may be continuously grown such that there are no regrowth interfaces between the drift region and the plurality of mesas. Further, the dopant of the first type may be an N-type dopant, and the dopant of the second type may a P-type dopant in certain embodiments and the opposite in other embodiments.

In one embodiment, each of the plurality of mesas are elongated stripes such that one of the plurality of trenches is provided between adjacent pairs of the plurality of mesas. Alternatively, each of the plurality of mesas may be pillars a having horizontal cross-section of virtually any shape such as circular, square, rectangular, polygonal, or the like.

The drift region may have a plurality of regions with different doping concentrations. Each of the plurality of mesas may have a plurality of regions with different doping concentrations. One or more of the plurality of mesas or the drift regions may have at least one region with a graded doping profile. The drift region may have at least one charge spreading layer below the plurality of mesas and at least one drift layer.

In one embodiment, a doping concentration of the second type for the first material is at least two times that of a doping concentration of the first type in the plurality of mesas.

In one embodiment, a width at a most narrow portion of each of the plurality of mesas is between one and two times that of a height of each of the plurality of mesas.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure. The FIGS. identify exemplary doping polarities, or types, (N-type and P-type) for the various layers, regions, and/or sections of the vertical semiconductor devices for concise and readability. These polarities, or types, may be reversed in alternative embodiments.

FIGS. 3A-3F illustrate part of a first exemplary fabrication process according to one embodiment of the present disclosure.

FIGS. 7A-7K illustrate part of a first exemplary fabrication process according to one embodiment of the present disclosure.

DETAILED DESCRIPTION

Figure 1A:
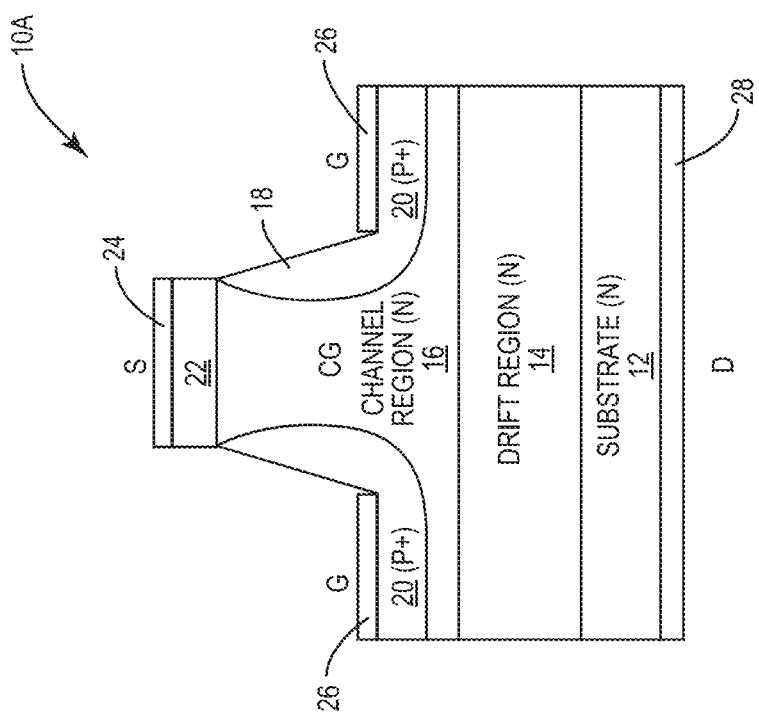
FIGS. 1A and 1B are a cross-sectional view and a top view of a junction field-effect transistor (JFET) according to a first related art.

The embodiments set forth below represent the necessary information to enable those skilled in the art to practice the embodiments and illustrate the best mode of practicing the embodiments. Upon reading the following description considering the accompanying drawing figures, those skilled in the art will understand the concepts of the disclosure and will recognize applications of these concepts not particularly addressed herein. These concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. Doping concentrations are referenced using the nomenclature: aEb cm$^{-3}$, which represents a×10$^b$ cm$^{-3}$ and where cm is centimeters. For example, 5E16 cm$^{-3}$ equals 5×10$^{16}$ cm$^{-3}$, where a is 5 and b is 16. The Figures identify exemplary doping polarities, or types, (N-type and P-type) for the various layers, regions, and/or sections of the vertical semiconductor devices for concise and readability. These polarities, or types, may be reversed in alternative embodiments.

The present disclosure relates to vertical semiconductor devices, such as transistors, diodes, and the like as well as fabrication techniques for building the same. In one embodiment, fabrication entails initially providing a precursor comprising a substrate and a drift region over the substrate, wherein the substrate and the drift region are doped with a dopant of a first type and formed from a first material system. A plurality of trenches is etched into the drift region from a top surface of the drift region such that a plurality of mesas remains in an upper portion of the drift region. The plurality of trenches is then filled with a first material doped with a dopant of a second type, which is opposite in polarity as the first type. At least one first contact is provided over at least one of the plurality of mesas, and at least one second contact is provided over a bottom surface of the substrate.

In another embodiment, a vertical semiconductor device includes a substrate and a drift region over the substrate. The substrate and the drift region are doped with a dopant of a first type and formed from a first material system. A plurality of mesas extends from an upper portion of the drift region, wherein there are no regrowth interfaces between the drift region and the plurality of mesas. A first material doped with a dopant of a second type fills the trenches between each one of the plurality of mesas, and the second type opposite in polarity as the first type. At least one first contact is formed over at least one of the plurality of mesas. At least one second contact is formed over a bottom surface of the substrate. The first material system may be silicon carbide and the first material may be silicon carbide, silicon, or a metal.

Details for these fabrication techniques and device structures are provided below. Specific examples of junction field-effect transistors (JFETs) are illustrated; however, the concepts provided apply to other implanted regions of other types of transistors, such as MOSFETs and IGBTs as well as to junction barrier Schottky (JBS), merged PiN Schottky (MPS), and like diodes by modifying the contact structure and placement, as those skilled in the art will appreciate. The associated figures for the text below relate to a striped device structure of conducting channels that extend into the plane of the drawings, but the layouts are not limited to such structure. The surface layout could be stripes, rectangles, circles, polygons, and the like.

FIG. 1A illustrates a cross-sectional view of a junction field-effect transistor (JFET) 10A of the related art. The JFET 10A is a vertical JFET in that current flows vertically through the device between the source (S) and the drain (D) based on the voltage applied at the gate (G). In the illustrated embodiment, the JFET 10A includes a substrate 12, a drift region 14 over the substrate 12, and a channel region 16 over the drift region 14. The upper portion of the body of the JFET 10A is etched to form a mesa 18. Gate regions 20 are formed in opposing sides of the mesa 18 and extend downward and outward along the upper portion of the body of the JFET 10A. As such, the channel region 16 resides between the gate regions 20 in the mesa 18 as well as between the bottom of the respective gate regions 20 and the top of the drift region 14.

An ohmic region 22 is formed in the top of the mesa 18, wherein a source contact 24 is provided on the top of the ohmic region 22. Gate contacts 26 are formed on the recessed portions that reside on either side of the mesa 18. The gate contacts 26 reside over the horizontal sections of the respective gate regions 20. A drain contact 28 resides along the bottom of the substrate 12.

As illustrated, the body of the JFET 10A is silicon carbide (SiC); however, other semiconductor material systems, such as silicon (Si), Germanium (Ge), Silion Germanium (SiGe), Gallium Nitride (GaN), Aluminum Nitride (AlN), Gallium Oxide ($Ga_2O_3$), and diamond are applicable. The substrate 12, drift region 14, channel region 16, and gate regions 20 may be SiC, wherein each section is formed by implanting N-type or P-type dopants at varying locations and concentrations within the body of the JFET 10A. In the illustrated example, the substrate 12 is moderately doped with an N-type dopant, the drift region 14 is moderately doped with an N-type dopant, the channel region 16 is moderately doped with an N-type dopant, the gate regions 20 are heavily doped with a P-type dopant, and the ohmic region 22 is heavily doped with an N-type dopant. As those skilled in the art will appreciate, the actual and relative doping levels for each region of the JFET 10A will depend on the desired characteristics of the JFET 10A and may vary from one application to another. The polarity of the doping for each region may be reversed from what is illustrated in the embodiments that follow. The source, gate, and drain contacts 24, 26, 28 may be formed from an appropriate metal or other highly conductive material.

The vertical portion of the mesa 18 that resides between the gate regions 20 provides the JFET conducting gap CG. The illustrated section is a cross-section of a full repeating cell in a larger device that comprises many cells, which are striped in the Z-direction (into the figure). The mesa 18 is formed by an etching process, and the gate regions 20 are formed using angled implants at different orientations. In the illustrated example, the implants are provided at four different angles. As such, fabrication of this embodiment is a complex process, and the more complex the process, the more expensive it is to fabricate the device. To further complicate matters, the amount of the P-type dopant along the sides of the mesa 18 necessary to form the gate regions 20 is a function of the angle of the sidewalls of the mesa 18. Angled implants at four incident directions are made to achieve P+ type gate regions 20, which generally surround each stripe of the N-type channel region 16 that is within the mesa 18. As such, etch control for the formation of the mesa 18 is a critical, complex, and relatively expensive process.

Figure 1B:
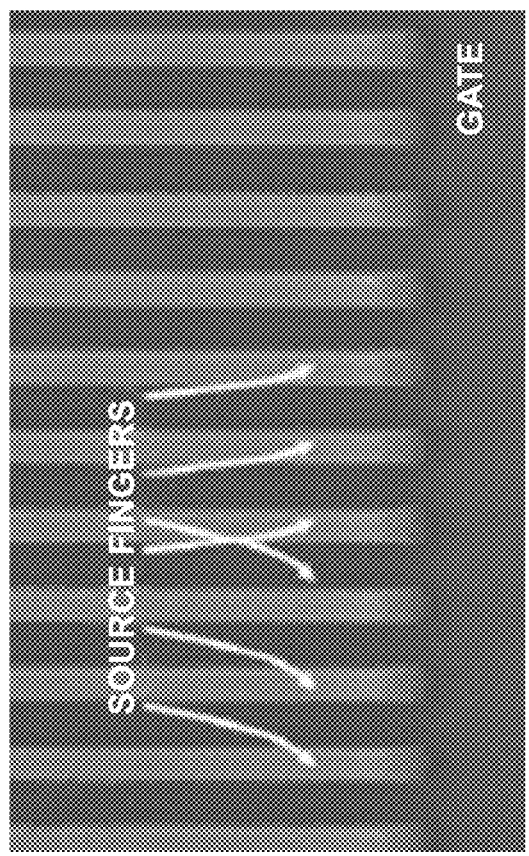

FIG. 1B is a cross-sectional SEM image of the device showing the gate contacts 26 and source fingers S running in the z-direction. Further information can be found in Kiran Chatty, David C Sheridan, Volodymyr Bondarenko, Robin Schrader, and Jeffrey B Casady, "900V, 1.46 mOhm-cm2 4H—SiC Depletion Mode Vertical JFET," Materials Science Forum, Vols. 740-742, pp 915-920 (2013), which is incorporated by reference in its entirety.

Figure 2:
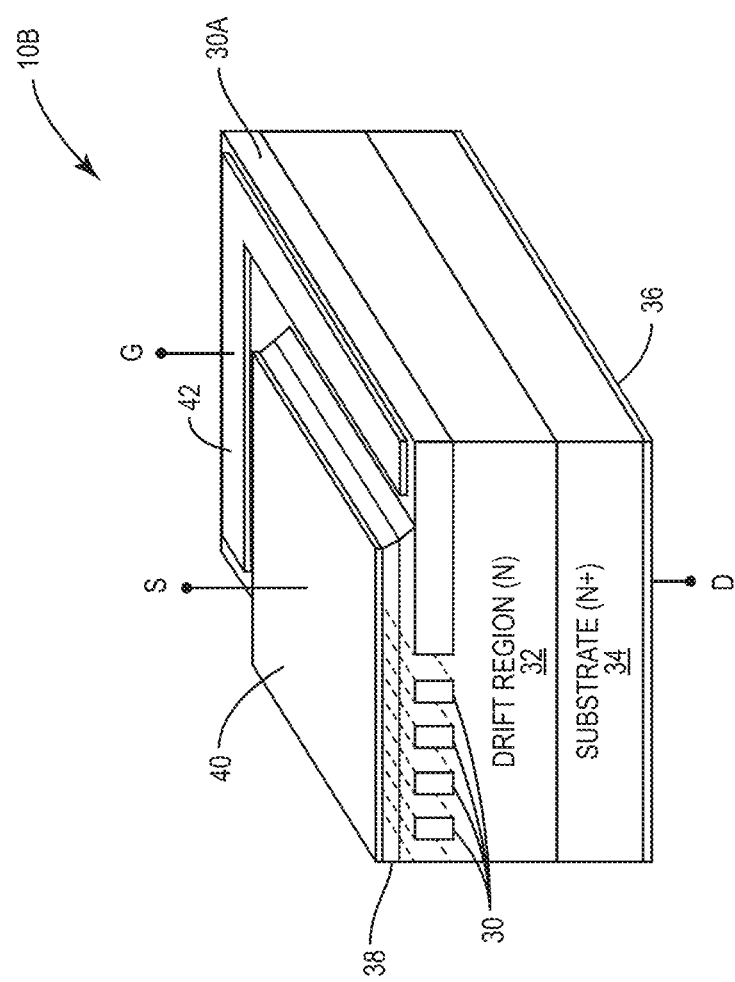
FIG. 2 is a sectional view of a transistor according to a second related art.

FIG. 2 illustrates another JFET structure 10B of the related art that includes P+ type gate stripes 30 that are buried in an N-type drift region 32. The drift region 32 resides over an N+ type SiC substrate 34, which includes a drain contact 36 on a bottom portion thereof. The gate stripes 30 are created by forming a P-type layer (not shown) and etching that layer to leave the gate stripes 30 that are illustrated. Subsequently, N-type material is used to fill in the trenches between the gate stripes 30 to provide a layer of N-type material over the gate stripes 30 to provide the remainder (i.e. upper portion) of the drift region 32 such that the gate stripes 30 are buried in the drift region 32. The upper portions of the drift region 32 that is between the gate stripes 30 are the channel regions. A disadvantage of this type of process is that the channel regions and the drift region 32, which carry the current for the JFET 10B are not continuously grown. Whenever current must flow through an interface where the growth process has been stopped and then started again, inefficiencies are induced due to the breaks in the lattice structure at the interface between the two regions.

An ohmic contact 38 is formed in an upper portion of the layer where the source contact 40 resides. A gate contact 42 is connected to a gate area 30A that is formed with the gate stripes 30, so that every gate area 30A or gate stripe is connected. The long gate stripes lead to high resistance and slow the switching speeds, and a portion of the drift region 32 is formed by epi regrowth after etching. Unfortunately, the drift region 32 is the critical semiconductor portion that carries all the device current and should be as defect free as possible to optimize performance. Further information can be found in Yasunori Tanaka, Koji Yano, Mitsuo Okamoto, Akio Takatsuka, Kazuo Arai and Tsutomu Yatsuo, "1270V, 1.21 mΩ·cm2 SiC Buried Gate Static Induction Transistors (SiC-BGSITs)," Materials Science Forum, Vols. 600-603, pp 1071-1074 (2009), which is incorporated herein by reference in its entirety. As provided in the embodiments below, improvements over the related art are provided by having the channel regions formed in an original epitaxial layer to avoid the defects inherent in regrowth processes.

FIGS. 3A through 3F illustrate a first exemplary process for fabricating a vertical semiconductor device according to one embodiment of the disclosure. Initially, a precursor 50 is provided as illustrated in FIG. 3A. The precursor 50 may be continuously grown SiC or the like having a substrate 52, which is heavily doped (N+) with an N-type dopant, a drift region 54 over the substrate, which is moderately doped (N) with an N-type dopant, and an ohmic layer 56 over the drift region 54, which is heavily doped (N+) with an N-type dopant. The ohmic layer 56 may be continuously grown with the precursor 50 as noted above or grown as a separate epitaxial layer.

Next, trenches 58 are etched into the top surface of the precursor 50, wherein the trenches 58 are in locations where gate regions 64 (FIGS. 3D and 3E) will be formed in subsequent steps, as illustrated in FIG. 3B. The unetched portions of the precursor 50 between the trenches 58 are referred to as mesas 60. Each mesa 60 provides a channel region 62 and an ohmic region 64 over the channel region 62. The ohmic region 64 for each mesa 60 is formed from an unetched portion of the ohmic layer 56 while each channel region 62 is formed from an unetched portion of the drift region 54.

Once the trenches 58 are formed, a gate layer 66 is formed in the trenches 58 and over the top portions of the ohmic regions 64 of the mesas 60, as illustrated in FIG. 3C. The gate layer 66 is doped with a P-type dopant. In the illustrated embodiment, the gate layer 66 is P-type silicon carbide; however, P-type silicon or an appropriate p-type conductor, such as nickel oxide, may also be used. For P-type silicon, use of an epitaxial film is not necessary. The trenches 58 may be simply filled with the P-type silicon by chemical vapor deposition or other similar film deposition methods. Other materials for the gate layer and/or the gate regions 68 include any other P-type material that is chemically compatible with SiC. At this point, the gate layer 66 is then planarized, if necessary, using an etch process or the like to remove the upper portion of the gate layer 66 that extends above the top surface of the mesas 60 such that the ohmic regions 64 are exposed, as illustrated in FIG. 3D. The remaining portions of the gate layer 66 that fill the trenches 58 provide gate regions 68.

After planarizing, gate contacts 70 are formed on top of each gate region 68, and source contacts 72 are formed on the ohmic regions 64 over the channel regions 62 for each mesa 60, as illustrated in FIG. 3E. A drain contact 74 is formed on the bottom of the substrate 52 at this point, if the drain contact 74 was not already provided on the precursor 50. In one embodiment, the mesas 60, channel regions 62, gate regions 68, source contacts 72, and the gate contacts 70 are linear stripes that extend into FIG. 3E. These features may take on a variety of shapes, as will be described further below.

An alternative process for forming the source contacts 72 is provided in FIG. 3F. The process through FIG. 3D remains the same as that described above. As such, the gate contacts 70 are formed on top of each gate region 68, but the source contacts 72 are not formed as stripes at this stage. Instead, and dielectric 83, such as an appropriate gate oxide 83, is formed over the gate contacts 70 such that the ohmic regions 64 over the channel regions 62 remain exposed. A metal or other conductive material is then formed over the top of the precursor 50 to form a unified source contact 72', which covers the dielectric 83 and the ohmic regions 64 such that the unified source contact 72' makes electrical contact with the ohmic regions 64 and is electrically isolated from the gate contacts 70.

For these embodiments, there is no need for an angled implant as required for the JFET 10A of FIGS. 1A and 1B, and a trench etch is used in the N-type SiC of the precursor 50 instead of the P-type layer as done for the JFET of FIG. 2. As such, current is carried through the continuously grown N-type epitaxial channel regions 62 and drift region 54 instead of a regrown epitaxial structure as required for the JFET 10B of FIG. 2.

In select embodiments, the substrate 52 is heavily doped with an N-type dopant at exemplary concentrations in the range of 1E18 to 1E19 cm$^{-3}$; 1E19 to 1E20 cm$^{-3}$; or 1E18 to 1E19 cm$^{-3}$, and the drift region 54 is moderately doped with an N-type dopant at exemplary concentrations in the range of 1E15 to E16 cm$^{-3}$; 1E16 to 2E17 cm$^{-3}$; or 1E15 to 2E17 cm$^{-3}$, the channel regions 62 are moderately doped with an N-type dopant at exemplary concentrations in the range of 1E15 to E16 cm$^{-3}$; 1E16 to 2E17 cm$^{-3}$; or 1E15 to 2E17 cm$^{-3}$, the gate regions 68 are heavily doped with a P-type dopant at exemplary concentrations in the range of 5E16 to 1E18 cm$^{-3}$; 1E18 to 1E20 cm$^{-3}$, or 5E16 to 1E20 cm$^{-3}$, the ohmic regions 64 are heavily doped with an N-type dopant at exemplary concentrations in the range of 1E18 to 1E19 cm$^{-3}$; 1E19 to 1E21 cm$^{-3}$; or 1E18 to 1E21.

In certain embodiments, the doping concentration levels for the gate regions 68 are at least 1.5 times, 2 times, or 2.5 times that of the channel regions 62, which are provided by the mesas 60 that extend vertically upward from the top of the drift region 54. Generally, the doping of the gate regions 68 should be high enough to allow the channel regions 62 to deplete under reverse bias conditions. The height of the mesas 60 (channel regions 62) may be one to two times (1×-2×) that of the width of the mesas 60 (channel regions 62). The width of the trenches 58 may range from 0.5 microns to 5 microns, 0.75 micron to 4 microns, 1 micron to 3.5 microns, 1 micron to 4 microns, and 1.5 to 3.5 microns.

The concepts provided are particularly beneficial in power applications. Such applications are defined as those having blocking voltages of more than 400V when reversed biased, capable of passing current more than 1 A when forward biased, and/or having a power rating of at least 2 Watts.

These are merely exemplary doping levels and dimensions, wherein embodiments that incorporate the inventive concepts described herein and within the scope of the claims that follow may fall anywhere within or outside of the ranges listed above depending on the desired performance parameters of the device. Unless otherwise stated, these exemplary doping concentrations apply to the embodiments that follow. Where graded doping levels are discussed, the graded doping profiles may range from the lower to the higher ends of the stated ranges and increase or decrease in concentration from the bottom to the top of the particular region.

Figure 4B:
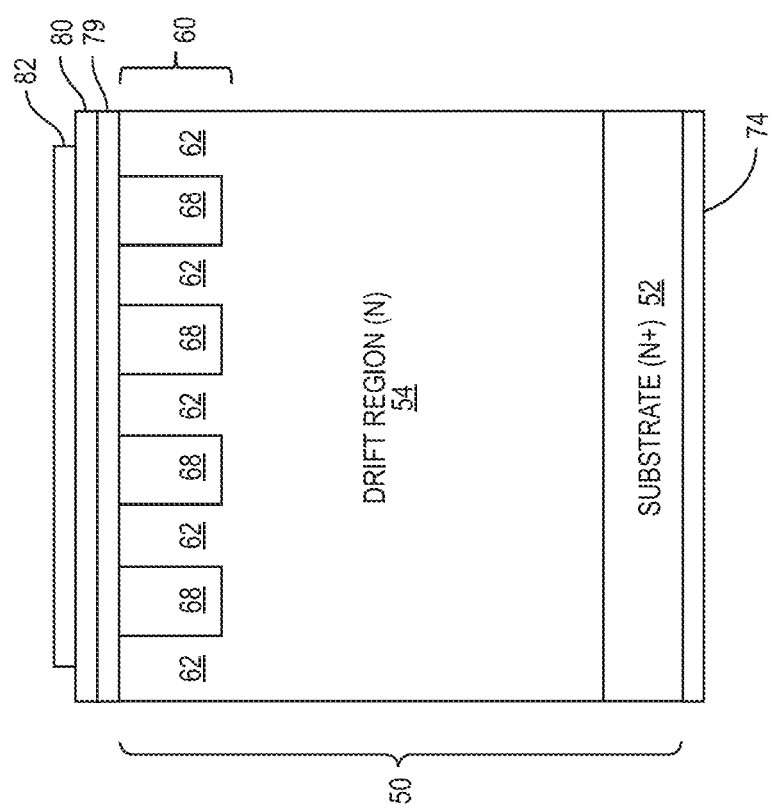
FIGS. 4A-4C illustrate part of a second exemplary fabrication process according to one embodiment of the present disclosure.
Figure 4A:
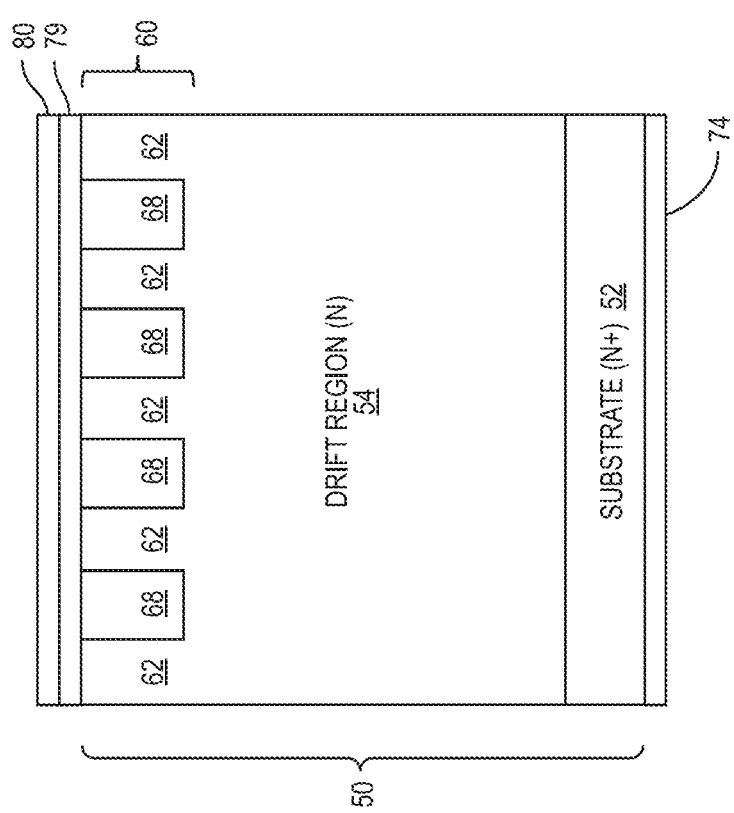
Figure 4C:
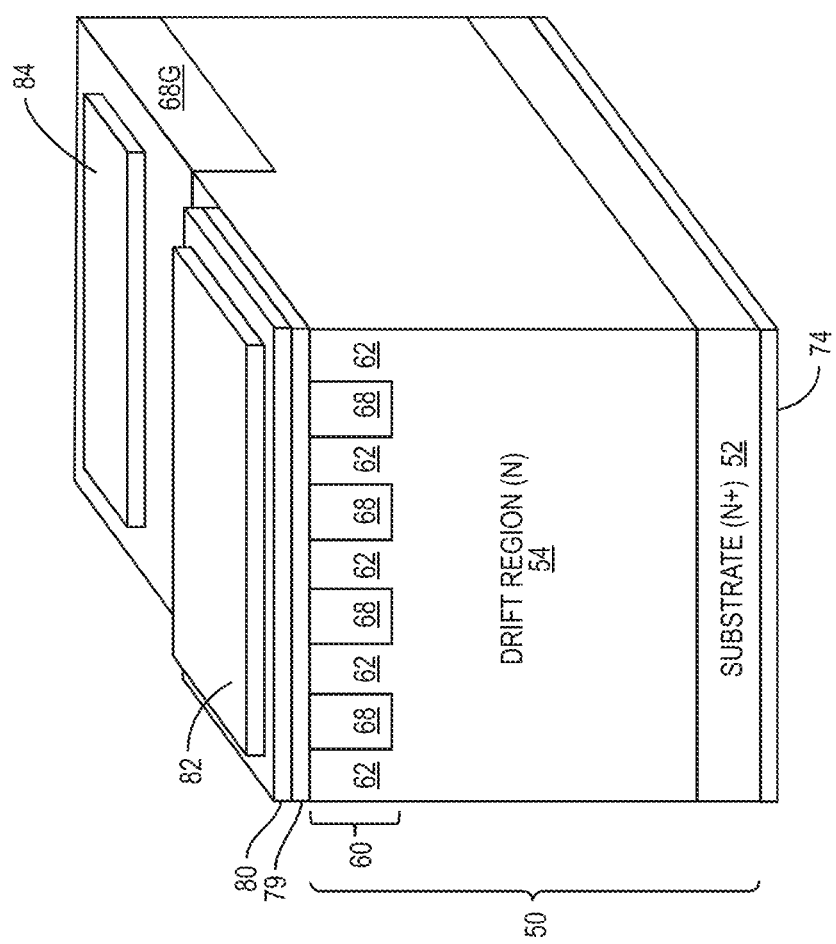

Another embodiment is illustrated in FIGS. 4A through 4C. The process is the same as that of FIGS. 3A through 3D, wherein the ohmic regions 64 at the top of the mesas 60 are optional. Once the gate layer 66 is planarized to form the various gate regions 68, an isolation layer 79 is applied over a portion of the top surface of the precursor 50 and an ohmic layer 80 is applied over the top surface of the isolation layer 79 using a deposit and etching process or the like, as illustrated in FIG. 4A. The isolation layer 79 and the ohmic layer 80 covers portions of the gate regions 68 and channel regions 62 where one or more source contacts 82 are to be applied. The one or more source contacts 82 are then formed over the ohmic layer 80, as illustrated in FIG. 4B. Gate contacts 84 may be formed directly over an exposed gate region 68G in this or a separate step, as illustrated in FIG. 4C. The gate contact 84 makes ohmic contact with the P-type gate region 68G, which is an extension of the gate regions 68, but does not make ohmic contact with the source contact 82. In other words, the metals for the respective source contact 82 and gate contact 84 are isolated from each other. The isolation layer 79 and the ohmic layer 80 may be formed as an integral layer with different N-type doping levels or in separate steps.

In this embodiment, a gate connector region 68G is formed perpendicular to and intersects with the various gate regions 68, which are elongated stripes in this embodiment, as illustrated in FIG. 4C. The gate contact 84 resides over the gate connector region 68G, wherein there is no N-type material, such as the ohmic layer 80 between the gate contact 84 and the gate connector region 68G. An upper portion of or an additional layer over the gate connector region 68G may be heavily doped (P-type) to provide an ohmic region to facilitate the electrical connection between the gate contact 84 and the gate connector region 68G. The gate regions 68 may also be epitaxially grown with the rest of the precursor 50 or formed from deposited silicon or other P-type material. This is possible because the P-type gate material does not carry the primary device current.

Figure 5:
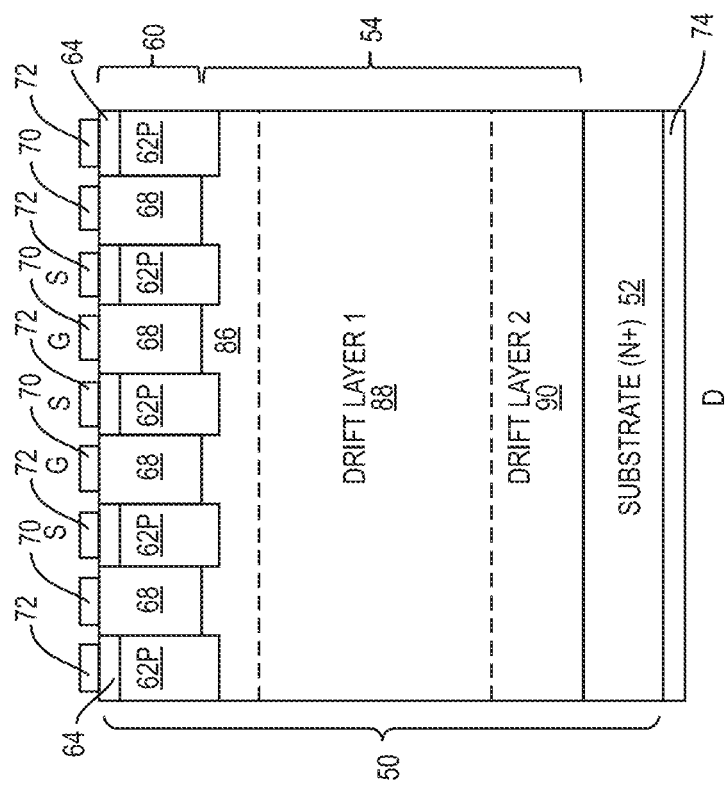
FIG. 5 is a cross-section of a JFET according to one embodiment of the present disclosure.

For any of the embodiments described herein, any of the various regions and layers may have the same or different doping levels using uniform and/or graded doping profiles. FIG. 5 illustrates some of these concepts, which may be provided individually or in combination. The drift region 54 may be divided into multiple layers 88, 90, wherein a charge spreading layer 86 may be provided near an upper portion of the drift region 54 and just below the mesas 60, such that the mesas 60 effectively extend from the charge spreading layer 86. One or more drift layers 88, 90 may be provided below the charge spreading layer 86. Each of these layers may have a uniform or graded doping profile. Further, the channel regions 62 may have a uniform or graded doping profile 62P with any of the doping combinations for the drift region 54. These doping options provide the designer with the ability to tailor the electrical properties of the device, such as the on-state and off-state properties.

FIGS. 6 and 7A-7J illustrate embodiment where the N-type mesas 60 and channel regions 62 take the form of pillars, as opposed to the elongated stripes of the prior embodiments. The pillar-shaped channel regions 62 may a horizontal cross-section of virtually any shape, such as square, rectangular, circular, octagonal, hexagonal, triangular, or the like. This grid-like layout may reduce gate resistance by reducing contact connection distances. Such embodiments may provide for a larger source contact 82, as illustrated relative to the previous embodiments, while reducing layout challenges associated with having to work around numerous elongated gate contacts 84. The N-type isolation layer 79 and ohmic layer 80 effectively isolate the source contact 82 from the gate regions 68.

Figure 6:
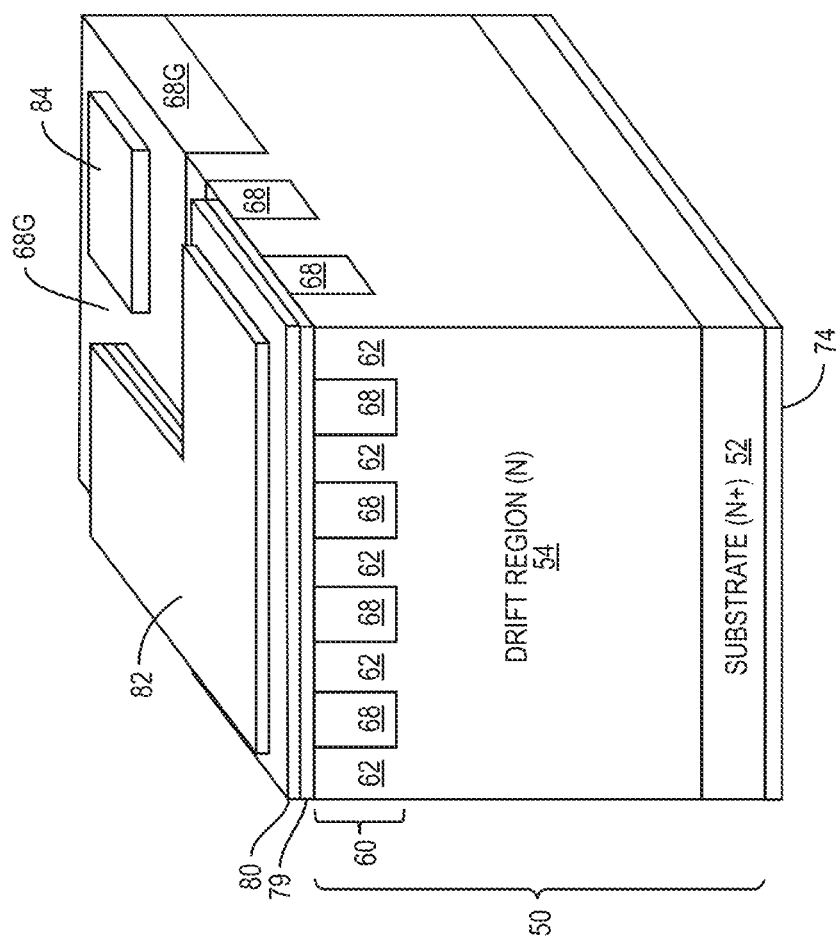
FIG. 6 is a JFET according to one embodiment of the present disclosure.
Figure 7K:
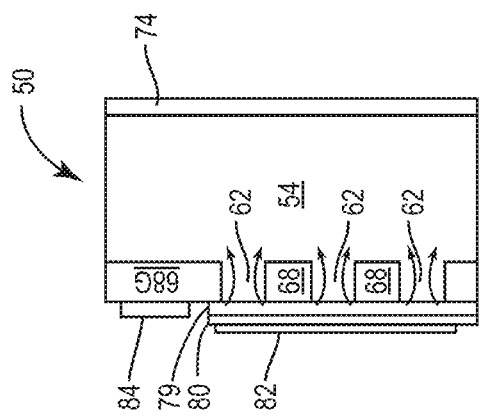

FIGS. 7A through 7K illustrate notable steps of an exemplary fabrication process for the embodiment of FIG. 6. FIGS. 7A and 7B are top and side views of the precursor 50 after the etch step. In this embodiment, the mesas 60 have a square cross-section and are aligned in a grid pattern. FIGS. 7C and 7D are top and side views of the precursor 50 after the gate layer 66 (not shown) is planarized to form the gate region(s) 68. In this embodiment, there is a gate area 68G on the precursor that has no mesas 60 and is reserved for the gate contact 84 (not shown). Notably, the portion of the gate region(s) 68 in the gate area 68G is integrally formed and connected with those portions surrounding the mesas 60. The mesas 60 provide the channel regions 62, wherein the upper portions of the mesas 60 are heavily doped to provide ohmic contacts 64.

Figure 7I:
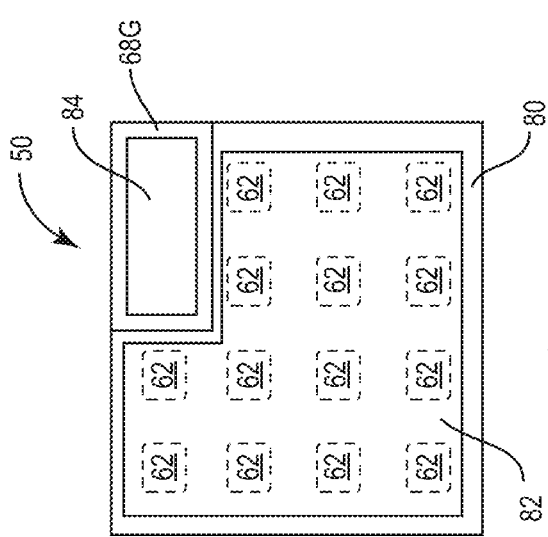
Figure 7J:
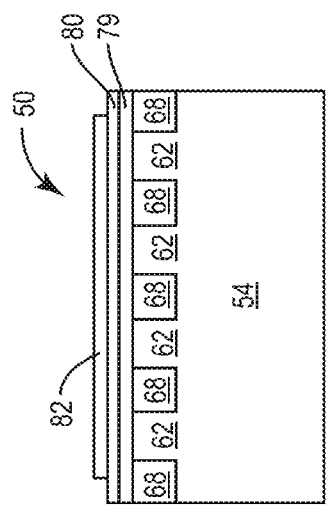
Figure 7G:
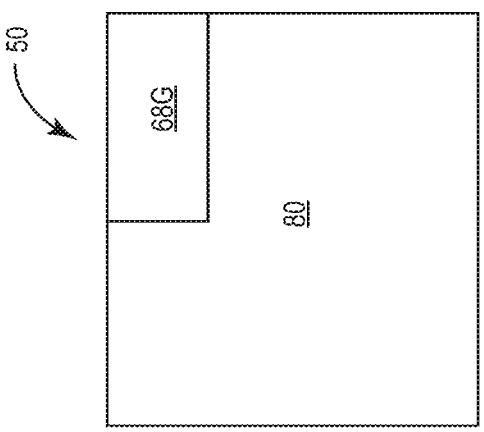
Figure 7H:
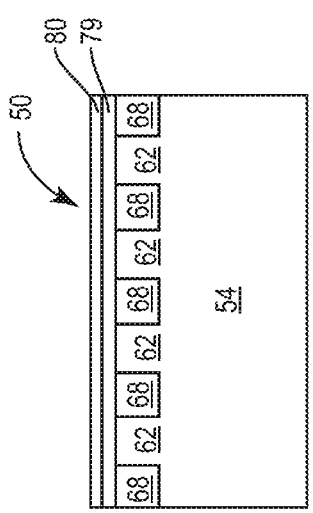
Figure 8C:
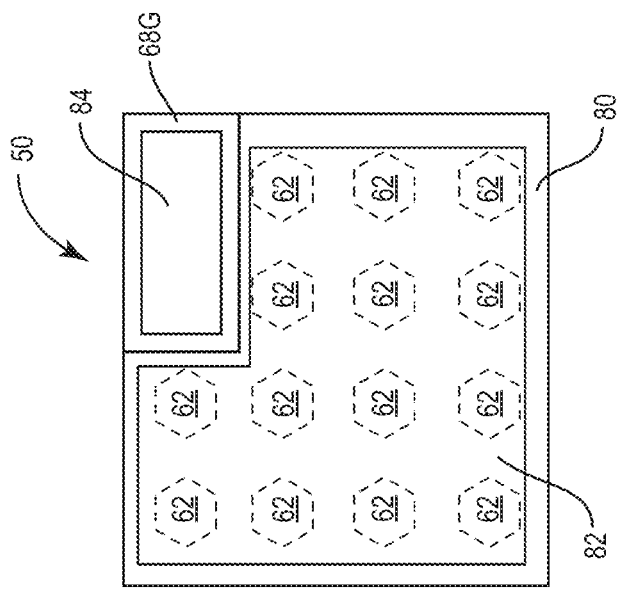
FIGS. 8A-8C illustrate part of a first exemplary fabrication process according to one embodiment of the present disclosure.
Figure 8B:
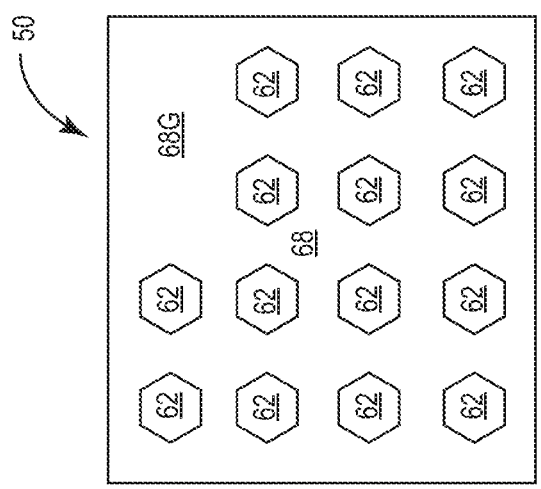
Figure 8A:
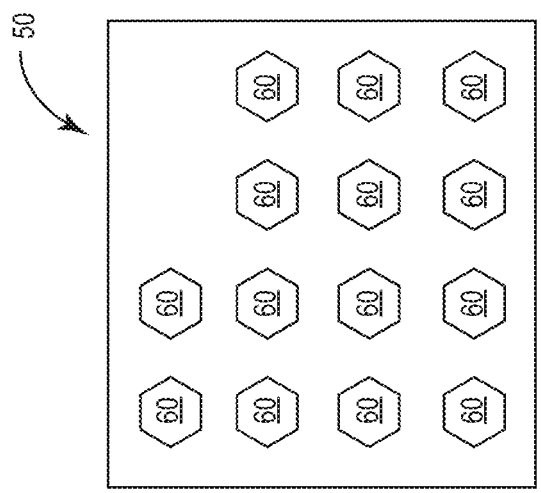

FIGS. 7E and 7F are top and side views of the precursor 50 after the isolation layer 79 is formed over the active region of the device. FIGS. 7G and 7H are top and side views of the precursor 50 after the N-type ohmic layer 80 is provided over the isolation layer 79 over the isolation layer 79, such that the N-type isolation layer 79 and the ohmic layer 80 do not cover the gate area 68G. After the N-type ohmic layer 80 is provided, the source contact 82 is provided over ohmic layer 80, and the gate contact 84 is provided over the gate area 68G, as illustrated in FIGS. 7I-7K. The source contact 82 and the gate contact 84 are separated from each other. FIGS. 8A, 8B, and 8C illustrate mesas that have a hexagonal cross-section and correspond to FIGS. 7A, 7C, and 7E.

Figure 9A:
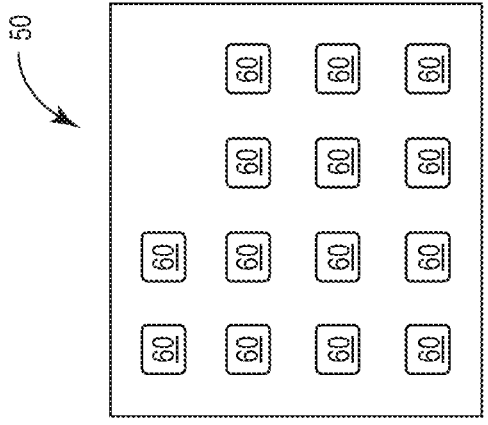
FIGS. 9A-9K illustrate part of a first exemplary fabrication process according to one embodiment of the present disclosure.
Figure 9C:
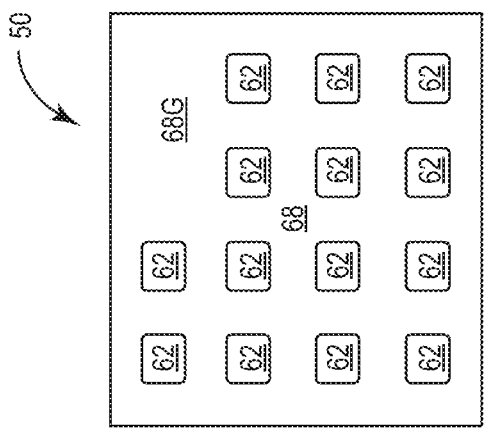
Figure 9E:
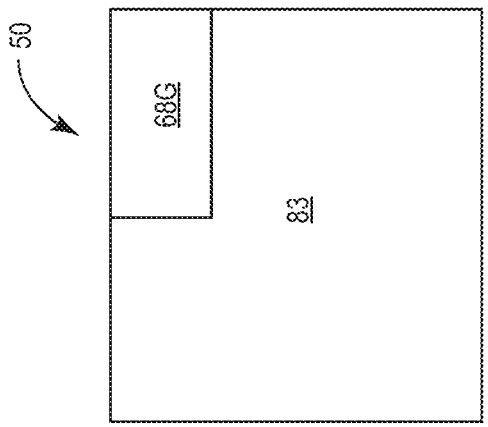
Figure 9B:
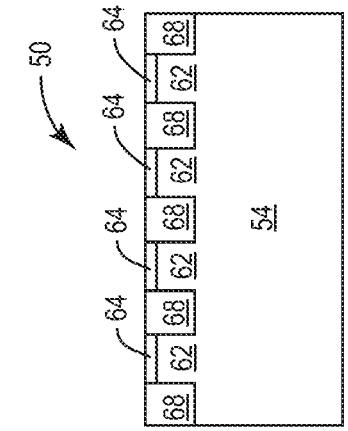
Figure 9D:
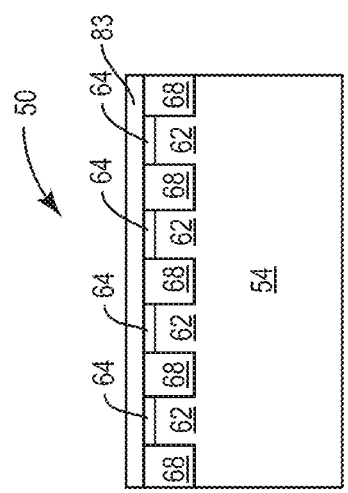

For a source contact configuration like that of FIG. 3F, reference is made to FIGS. 9A through 9K. FIGS. 9A and 9B are top and side views of the precursor 50 after the etch step. In this embodiment, the mesas 60 have a square cross-section and are aligned in a grid pattern. FIGS. 9C and 9D are top and side views of the precursor 50 after the gate layer 66 (not shown) is planarized to form the gate region(s) 68. In this embodiment, there is a gate area 68G on the precursor that has no mesas 60 and is reserved for the gate contact 84 (not shown). Notably, the portion of the gate region(s) 68 in the gate area 68G is integrally formed and connected with those portions surrounding the mesas 60. The mesas 60 provide the channel regions 62 wherein the upper portions of the mesas 60 are heavily doped to provide ohmic contacts 64.

Figure 9F:
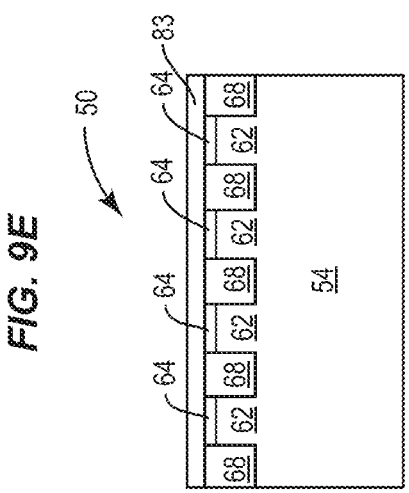
Figure 9K:
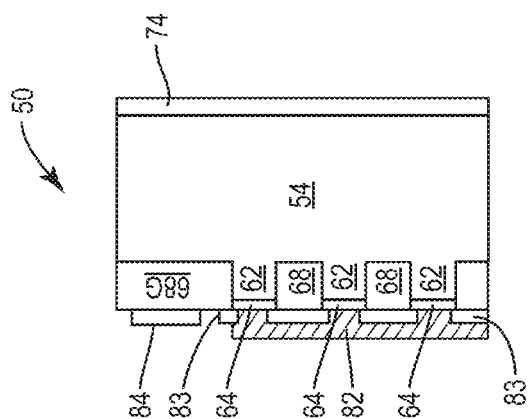
Figure 9I:
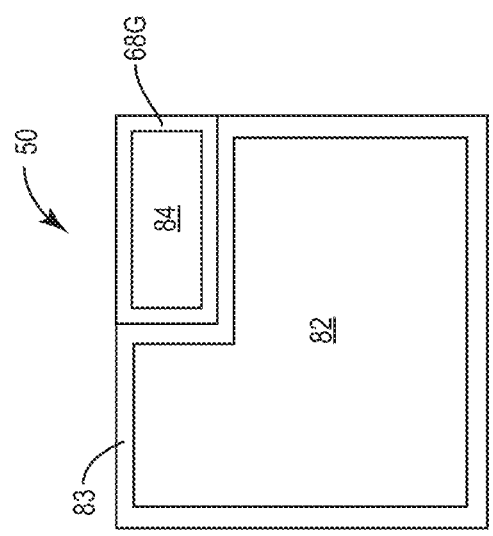
Figure 9J:
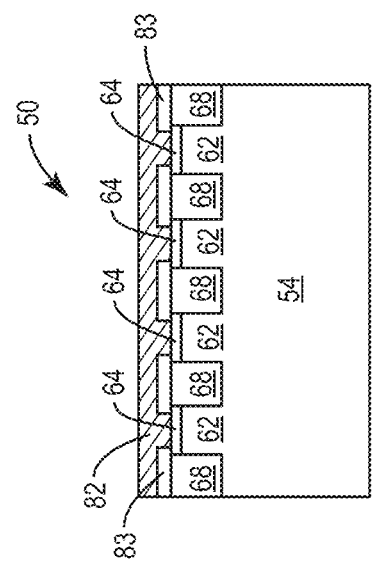
Figure 9G:
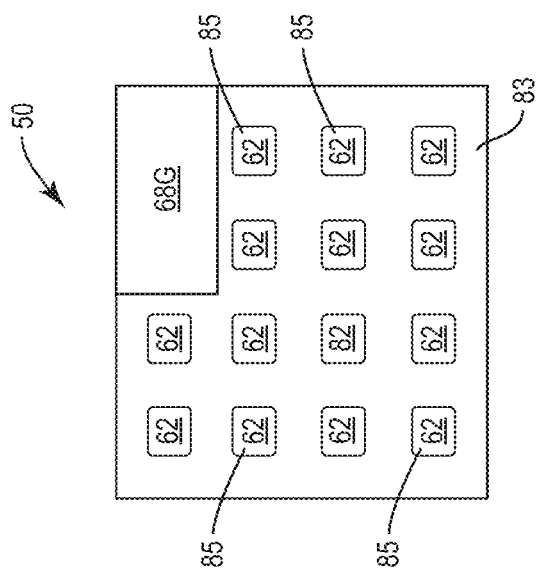
Figure 9H:
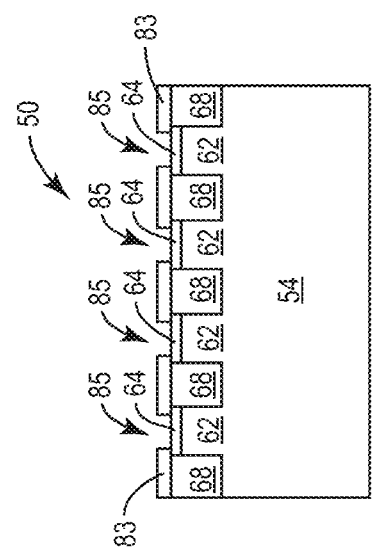

FIGS. 9E and 9F are top and side views of the precursor 50 after the dielectric layer 83' is formed over the active region of the device. FIGS. 9G and 9H are top and side views of the precursor 50 after openings 85 are formed in the dielectric layer 83 to expose the ohmic regions 64 of the channel regions 62. The dielectric layer 83 is formed or etched to not cover the gate area 68G. As illustrated in FIGS. 9I-9K, the source contact 82 is provided over dielectric layer 83 and into the openings 85 to cover the exposed surfaces of the ohmic layer 64. The gate contact 84 is provided over the gate area 68G.

Figure 10:
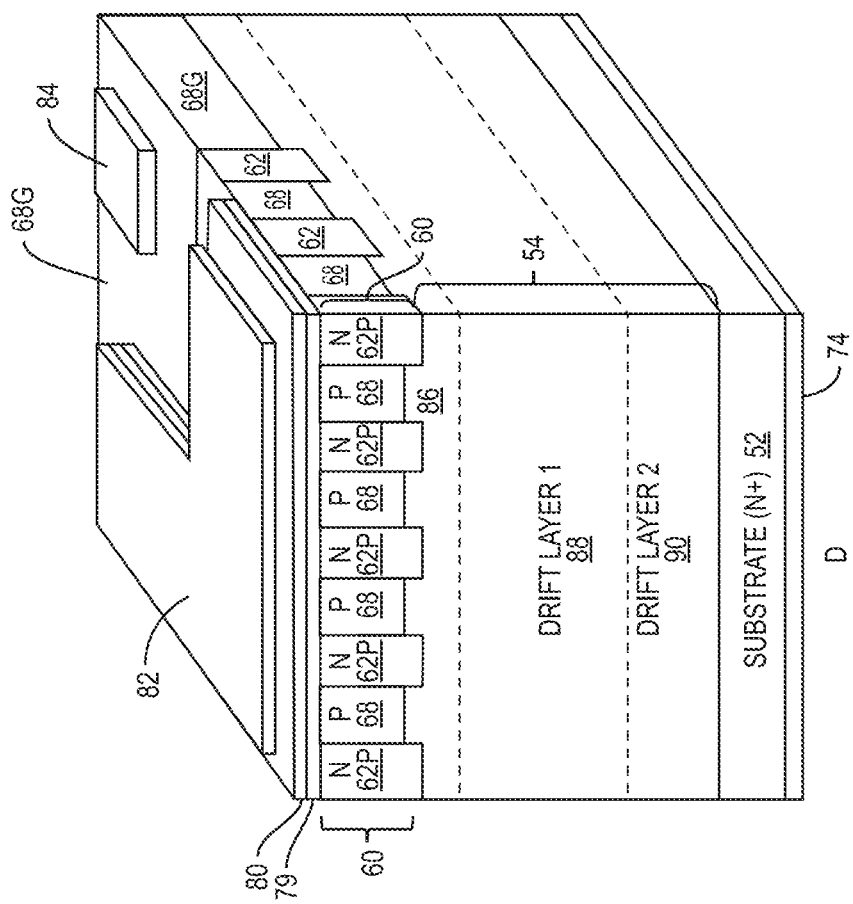
FIG. 10 is a cross-section of a JFET according to one embodiment of the present disclosure.
Figure 11:
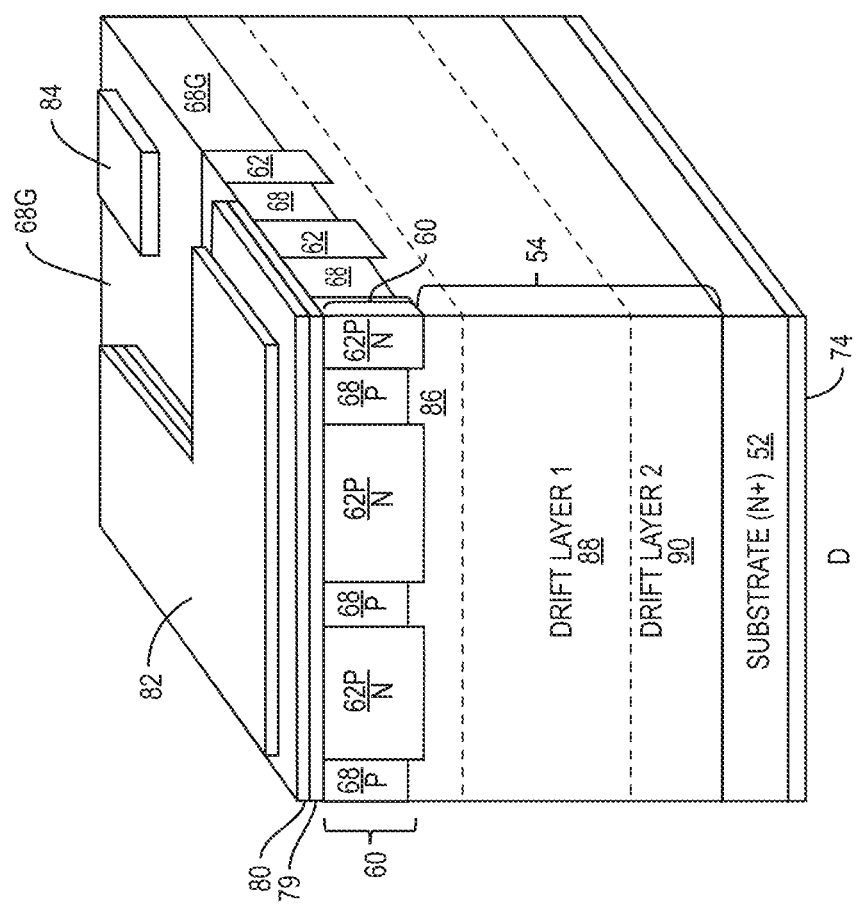
FIG. 11 is a cross-section of a JFET according to one embodiment of the present disclosure.

Embodiments like those described above may have various doping profiles and additional layers as discussed with FIG. 5. Such an embodiment is illustrated in FIG. 10. Note the presence of the charge spreading layer 86 and drift layers 88, 90 in the drift region 54. Each of the layers as well as the mesas 60 or source regions 62 may also have graded doping profiles. FIG. 11 illustrates a variant where the mesas 60/source regions 62 are elongated with a rectangular cross-section and the different regions are doped as described above in association with FIGS. 5, 6, and 10.

Figure 12:
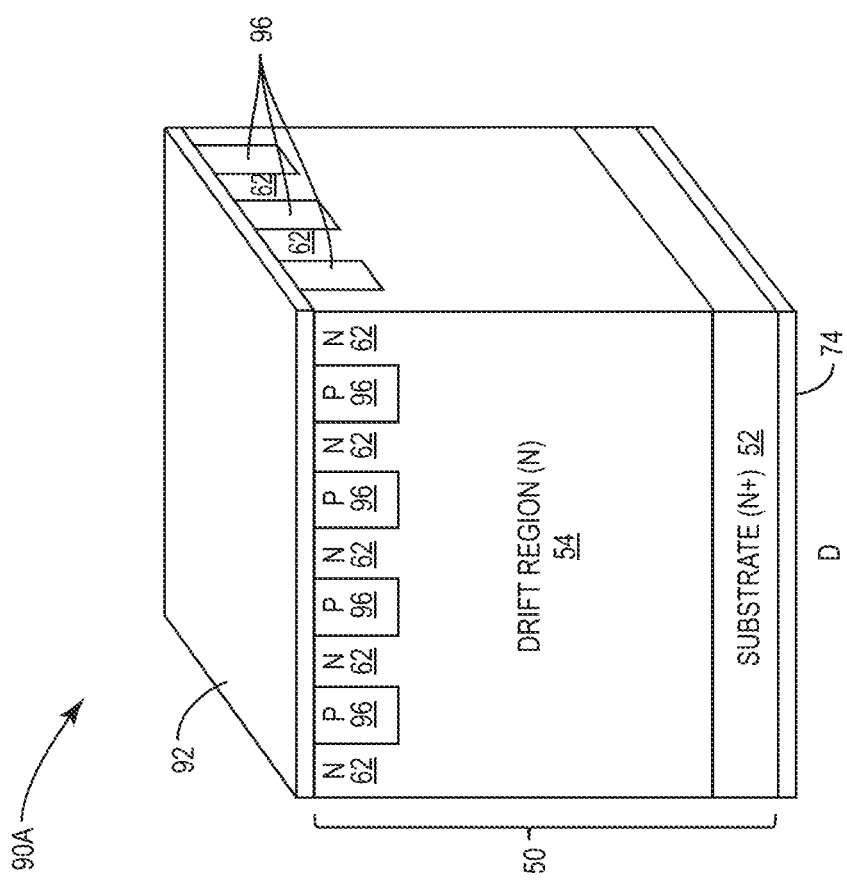
FIG. 12 is a cross-section of a vertical diode according to one embodiment of the present disclosure.
Figure 13:
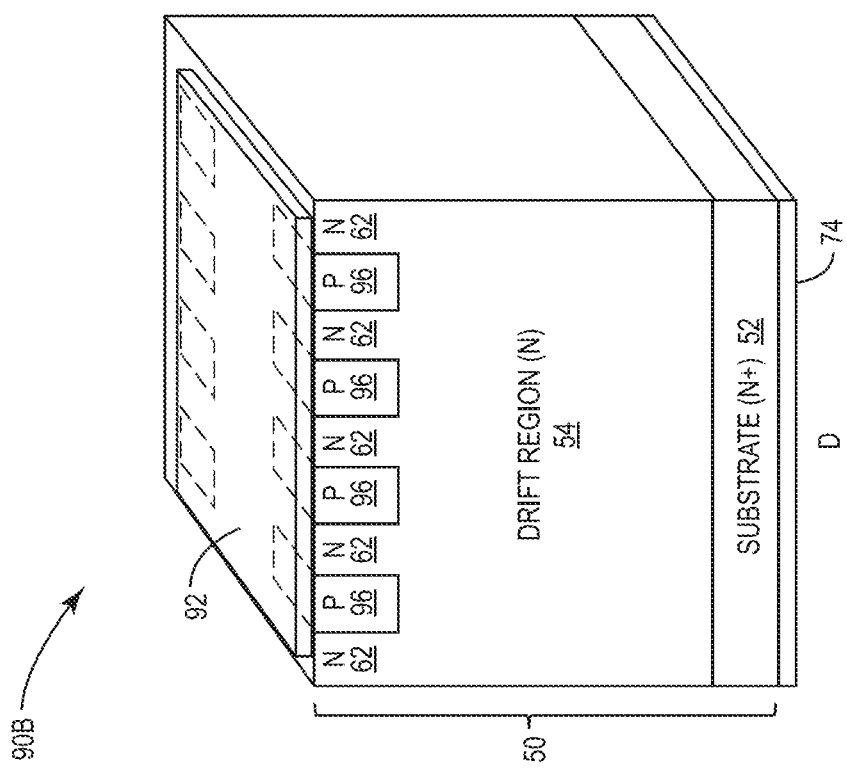
FIG. 13 is a cross-section of a vertical diode according to one embodiment of the present disclosure.

As noted, the concepts provided herein may be applied to various types of vertical semiconductor devices. FIGS. 12 and 13 illustrate exemplary vertical diode structures for vertical diodes 90A and 90B, respectively. The fundamental differences between the transistor devices described above and the vertical diodes 90A and 90B is the absence of a gate contact and the expansion of the source contact 92 and the underlying active area. The details and structure of the precursor 50 is essentially the same.

Diode 90A of FIG. 12 provides a grid of mesas 60 for the source regions 62, wherein the mesas 60 were formed using an etching process, and the resulting trenches were filled using deposition or growth processes with a P-type material to generate P regions 96 (i.e. gate regions). The trenches and resulting P regions 96 provide a cross-hatched pattern that surrounds a majority of the mesas 60.

Diode 90B of FIG. 13 further differs in that the mesas 60 interconnect and form a cross-hatched pattern. The P regions 96 are formed in holes that were etched into the drift region 54 and filled with P-type material. The holes, and thus the P regions 96, may take on virtually any geometry, such as having a horizonal cross-section that is square, rectangular, round, hexagonal, octagonal, triangular, and the like. In this embodiment, the mesas 60 form a cross-hatched pattern that surrounds the individual P regions, and mostly unconnected, P regions 96. The doping and additional layers provided in FIGS. 9 and 10 may be applied to the embodiments of FIGS. 12 and 13.

Those skilled in the art will recognize additional improvements and modifications to the disclosed embodiments of the present disclosure. All such improvements and modifications are considered within the scope of the concepts disclosed herein and the claims that follow.

What is claimed is:

1. A vertical semiconductor device comprising:
a substrate;
a drift region over the substrate, wherein the substrate and the drift region are doped with a dopant of a first type;
a plurality of channel regions extending from an upper portion of the drift region, wherein there are no regrowth interfaces between the drift region and the plurality of channel regions;
a first material doped with a dopant of a second type and filling trenches between each one of the plurality of channel regions, the second type opposite in polarity to the first type;
at least one first contact over at least one of the plurality of channel regions; and
at least one second contact over a bottom surface of the substrate.

2. The vertical semiconductor device of claim 1 wherein the drift region is silicon carbide.

3. The vertical semiconductor device of claim 2 wherein the first material is silicon carbide.

4. The vertical semiconductor device of claim 2 wherein the first material is silicon.

5. The vertical semiconductor device of claim 2 wherein the first material is a metal.

6. The vertical semiconductor device of claim 1 further comprising a first layer of the first material that fills a plurality of trenches, wherein the vertical semiconductor device is a transistor, the first material that fills the plurality of trenches forms a plurality of gate regions, the at least one first contact is a source contact, and the at least one second contact is a drain contact; and further comprising at least one gate contact over at least a portion of the first layer.

7. The vertical semiconductor device of claim 6 wherein the at least one gate contact is not provided over the plurality of gate regions.

8. The vertical semiconductor device of claim 6 wherein the at least one gate contact comprises a plurality of gate contacts that are each provided over a corresponding one of the plurality of gate regions.

9. The vertical semiconductor device of claim 1 wherein the drift region and the plurality of channel regions are continuously grown such that there are no regrowth interfaces between the drift region and the plurality of channel regions.

10. The vertical semiconductor device of claim 1 wherein the dopant of the first type is an N-type dopant, and the dopant of the second type is a P-type dopant.

11. The vertical semiconductor device of claim 1 wherein each of the plurality of mesas is an elongated stripe, such that one of a plurality of trenches is provided between adjacent pairs of the plurality of mesas.

12. The vertical semiconductor device of claim 1 wherein each of the plurality of channel regions is a pillar.

13. The vertical semiconductor device of claim 12 wherein each of the pillars have a circular horizontal cross-section.

14. The vertical semiconductor device of claim 13 wherein each of the pillars has a square horizontal cross-section.

15. The vertical semiconductor device of claim 14 wherein each of the pillars has a polygonal horizontal cross-section.

16. The vertical semiconductor device of claim 1 wherein the drift region comprises a plurality of regions with different doping concentrations.

17. The vertical semiconductor device of claim 1 wherein each of the plurality of channel regions has a plurality of regions with different doping concentrations.

18. The vertical semiconductor device of claim 1 wherein at least one of the plurality of channel regions or the drift region has at least one region with a graded doping profile.

19. The vertical semiconductor device of claim 1 wherein the drift region comprises at least one charge spreading layer below the plurality of channel regions, and at least one drift layer.

20. The vertical semiconductor device of claim 1 wherein the vertical semiconductor device is a diode.

21. The vertical semiconductor device of claim 1 wherein a doping concentration of the second type for the first material is at least two times that of a doping concentration of the first type in the plurality of channel regions.

22. The vertical semiconductor device of claim 1 wherein a width at a most narrow portion of each of the plurality of channel regions is between one and two times that of a height of each of the plurality of channel regions.

23. The vertical semiconductor device of claim 1 wherein the substrate and the drift region comprise a first material system.

* * * * *